United States Patent
Wang

(10) Patent No.: US 10,831,630 B2
(45) Date of Patent: Nov. 10, 2020

(54) FAULT ANALYSIS METHOD AND APPARATUS BASED ON DATA CENTER

(71) Applicant: Huawei Technologies Co., Ltd., Shenzhen (CN)

(72) Inventor: Feng Wang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 576 days.

(21) Appl. No.: 15/638,109

(22) Filed: Jun. 29, 2017

(65) Prior Publication Data

US 2017/0299645 A1 Oct. 19, 2017

Related U.S. Application Data

(63) Continuation of application No. PCT/CN2015/097903, filed on Dec. 18, 2015.

(30) Foreign Application Priority Data

Dec. 31, 2014 (CN) .......................... 2014 1 0856613

(51) Int. Cl.
*G06F 11/30* (2006.01)
*H04L 12/24* (2006.01)
(Continued)

(52) U.S. Cl.
CPC .......... *G06F 11/3051* (2013.01); *G01R 31/08* (2013.01); *G01R 31/088* (2013.01);
(Continued)

(58) Field of Classification Search
CPC ........ G01R 31/088; G01R 31/08; H02H 7/26; H02H 7/261; H04L 41/0631;
(Continued)

(56) References Cited

U.S. PATENT DOCUMENTS 8,031,634 B1 10/2011 Artzi et al.
8,661,295 B1 2/2014 Khanna et al.
(Continued)

FOREIGN PATENT DOCUMENTS

CN 102143008 A 8/2011
CN 102455951 A 5/2012
(Continued)

OTHER PUBLICATIONS

Walraed-Sullivan, Meg. Scalable, efficient, and fault-tolerant data center networking. Diss. UC San Diego, 2012.*

*Primary Examiner* — Paul Contino
(74) *Attorney, Agent, or Firm* — Slater Matsil, LLP

(57) ABSTRACT

Embodiments of the present invention disclose a fault analysis method based on a data center. The method includes obtaining a topology structure diagram, where nodes in the topology structure diagram include component devices of the data center and a virtual machine running on the data center. The method also includes, when a fault occurs in the data center, obtaining a fault alarm and determining, according to the topology structure diagram, whether the fault reduces communications paths between virtual machines in a virtual machine group running on the data center.

20 Claims, 5 Drawing Sheets

(51) Int. Cl.
  *G01R 31/08* (2020.01)
  *H02H 7/26* (2006.01)
(52) U.S. Cl.
  CPC ...... *G06F 11/3006* (2013.01); *G06F 11/3048* (2013.01); *H02H 7/26* (2013.01); *H02H 7/261* (2013.01); *H04L 41/0631* (2013.01); *H04L 41/065* (2013.01); *H04L 41/12* (2013.01)
(58) Field of Classification Search
  CPC ...... H04L 41/065; H04L 41/12; G06F 11/349; G06F 11/3051; G06F 11/3048; G06F 11/30
  See application file for complete search history.

(56) References Cited

U.S. PATENT DOCUMENTS

| | | | | |
|---|---|---|---|---|
| 2002/0188756 A1* | 12/2002 | Weil | ............... | H04L 41/0668 709/240 |
| 2008/0155324 A1* | 6/2008 | Gooding | ............... | G06F 11/079 714/25 |
| 2011/0191630 A1 | 8/2011 | Li et al. | | |
| 2013/0215769 A1* | 8/2013 | Beheshti-Zavareh | ............... | H04L 45/64 370/252 |
| 2014/0047444 A1 | 2/2014 | Yamaguchi | | |
| 2014/0052845 A1* | 2/2014 | Nayak | ............... | G06F 3/0605 709/224 |
| 2014/0165054 A1 | 6/2014 | Wang et al. | | |
| 2015/0067143 A1* | 3/2015 | Babakhan | ............... | G06F 11/301 709/224 |
| 2015/0074262 A1* | 3/2015 | Antony | ............... | H04L 47/125 709/224 |
| 2015/0095445 A1* | 4/2015 | Thankappan | ......... | H04L 45/125 709/214 |
| 2015/0127970 A1* | 5/2015 | Bivens | ............... | G06F 11/2007 714/4.11 |
| 2015/0153964 A1* | 6/2015 | Antony | ............... | G06F 9/45558 710/74 |
| 2015/0172222 A1* | 6/2015 | Liao | ............... | H04L 49/351 370/392 |
| 2016/0170848 A1* | 6/2016 | Yang | ............... | G06F 11/2023 714/4.12 |

FOREIGN PATENT DOCUMENTS

| | | |
|---|---|---|
| CN | 103294521 A | 9/2013 |
| CN | 103403689 A | 11/2013 |

* cited by examiner

FAULT ANALYSIS METHOD AND APPARATUS BASED ON DATA CENTER

CROSS-REFERENCE TO RELATED APPLICATIONS

This application is a continuation of International Application No. PCT/CN2015/097903, filed on Dec. 18, 2015, which claims priority to Chinese Patent Application No. 201410856613.5, filed on Dec. 31, 2014. The disclosures of the aforementioned applications are hereby incorporated by reference in their entireties.

TECHNICAL FIELD

The present invention relates to virtual machine technologies, and in particular, to a fault analysis method and apparatus based on a data center.

BACKGROUND

A data center mainly includes a host and a switching device. The host is also referred to as a physical machine, and is mainly configured to support operation of a virtual machine. The switching device is mainly configured to support communication between devices in the data center. The switching device usually includes a network node having a data exchange function, such as a switch, a router, or a gateway. It should be noted that because the host carries a virtual switch (vSwitch), the host also has a function of supporting data exchange between virtual machines. Many devices are included in the data center. If a fault occurs, an impact analysis of the fault on the data center needs to be obtained, so as to properly deal with the fault.

In an existing fault analysis in a data center, a fault level is determined only by using a type of a device in which a fault occurs, or a fault level is determined by determining whether a received fault alarm is a device fault alarm or a device performance alarm, and an accurate fault analysis cannot be made according to impact of a fault on a service running on the data center.

SUMMARY

To resolve the problem in the prior art, the present invention is put forward. By using the present invention, in a fault analysis of a data center in an existing technical solution, it can be resolved that the fault analysis cannot be accurately performed according to impact of a fault on a service running on the data center.

A first aspect of embodiments of the present invention provides a fault analysis method based on a data center. Component devices of the data center include at least two hosts and at least one switching device, at least one virtual machine runs on each host in the at least two hosts, the at least one switching device is configured to establish a communications path between the component devices of the data center, at least two virtual machines that have a communications dependence relationship and run on the at least two hosts form a virtual machine group. The fault analysis method includes: obtaining a topology structure diagram, where nodes in the topology structure diagram include the component devices and the virtual machines that run on the at least two hosts. The method also includes, when a fault occurs in the data center, obtaining a fault alarm and determining, according to the topology structure diagram, whether the fault reduces communications paths between the virtual machines in the virtual machine group.

With reference to the first aspect, in a first implementation of the first aspect, the determining, according to the topology structure diagram, whether the fault reduces communications paths between the virtual machines in the virtual machine group specifically includes: when determining, according to a connection relationship between the nodes in the topology structure diagram, that the fault causes no available communications path between at least one virtual machine in the virtual machine group and another virtual machine in the virtual machine group, determining that an error occurs in the virtual machine group.

With reference to the first implementation of the first aspect, in a second implementation of the first aspect, the data center has at least two virtual machine groups, and the method further includes: obtaining an impact level of the fault according to a quantity of faulty virtual machine groups caused by the fault and a service weight corresponding to each faulty virtual machine group.

With reference to the first aspect, in a third implementation of the first aspect, the determining, according to the topology structure diagram, whether the fault reduces communications paths between the virtual machines in the virtual machine group specifically includes: determining a fault ratio of the virtual machine group according to a connection relationship between nodes in the topology structure diagram, where the fault ratio specifically includes a ratio of a quantity of broken communications paths, caused by the fault, between the virtual machines in the virtual machine group to a total quantity of communications paths between the virtual machines in the virtual machine group.

With reference to the third implementation of the first aspect, in a fourth implementation of the first aspect, the data center has at least two virtual machine groups, and the method further includes: obtaining an impact level of the fault according to a fault ratio, caused by the fault, of each virtual machine group and a service weight corresponding to each virtual machine group.

With reference to any one of the first aspect or the first to the fourth implementations of the first aspect, in a fifth implementation, the at least two virtual machines that have a communications dependence relationship and form the virtual machine group specifically indicate at least two virtual machines for cooperatively executing a same service or application.

A second aspect of the embodiments of the present invention provides a fault analysis apparatus. The fault analysis apparatus is applied to a data center, component devices of the data center include at least two hosts and at least one switching device, at least one virtual machine runs on each host in the at least two hosts, the at least one switching device is configured to establish a communications path between the component devices of the data center, at least two virtual machines that have a communications dependence relationship and run on the at least two hosts form a virtual machine group. The fault analysis apparatus includes: an obtaining module, configured to obtain a topology structure diagram, where nodes in the topology structure diagram include the component devices and the virtual machines that run on the at least two hosts. The apparatus also includes an analysis module, configured to: when a fault occurs in the data center, obtain a fault alarm and determine, according to the topology structure diagram, whether the fault reduces communications paths between the virtual machines in the virtual machine group.

With reference to the second aspect, in a first implementation of the second aspect, the analysis module is specifically configured to: when determining, according to a connection relationship between the nodes in the topology structure diagram, that the fault causes no available communications path between at least one virtual machine in the virtual machine group and another virtual machine in the virtual machine group, determine that an error occurs in the virtual machine group.

With reference to the first implementation of the second aspect, in a second implementation, the data center has at least two virtual machine groups, and the fault analysis apparatus further includes: a first calculation module, configured to obtain an impact level of the fault according to a quantity of faulty virtual machine groups caused by the fault and a service weight corresponding to each faulty virtual machine group.

With reference to the second aspect, in a third implementation, the analysis module is specifically configured to determine a fault ratio of the virtual machine group according to a connection relationship between the nodes in the topology structure diagram, where the fault ratio specifically includes a ratio of a quantity of broken communications paths, caused by the fault, between the virtual machines in the virtual machine group to a total quantity of communications paths between the virtual machines in the virtual machine group.

With reference to the third implementation of the second aspect, in a fourth implementation, the data center has at least two virtual machine groups, and the fault analysis apparatus further includes: a second calculation module, configured to obtain an impact level of the fault according to a fault ratio, caused by the fault, of each virtual machine group and a service weight corresponding to each virtual machine group.

With reference to any one of the second aspect or the first to the fourth implementations of the second aspect, in a fifth implementation, the at least two virtual machines that have a communications dependence relationship and form the virtual machine group specifically indicate at least two virtual machines for cooperatively executing a same service or application.

The embodiments of the present invention provide a fault analysis method based on a data center. When a fault occurs in the data center, a fault alarm is sent to a device that performs a fault analysis. The device analyzes, according to a previously obtained topology structure diagram of the data center, whether the fault affects a communications path between virtual machines in a virtual machine group running on the data center. Therefore, importance of the fault is not determined according to only a type of a faulty device or a fault degree of a faulty device in an existing fault analysis method, and actual impact of the fault on each service running on the data center can be comprehensively analyzed. This promotes accuracy of a fault analysis in the data center.

BRIEF DESCRIPTION OF THE DRAWINGS

To describe the technical solutions in the embodiments of the present invention or in the prior art more clearly, the following briefly describes the accompanying drawings required for the embodiments. Apparently, the accompanying drawings in the following description show some embodiments of the present invention, and persons of ordinary skill in the art may still derive other drawings from these accompanying drawings without creative efforts.

DETAILED DESCRIPTION OF ILLUSTRATIVE EMBODIMENTS

Figure 1:
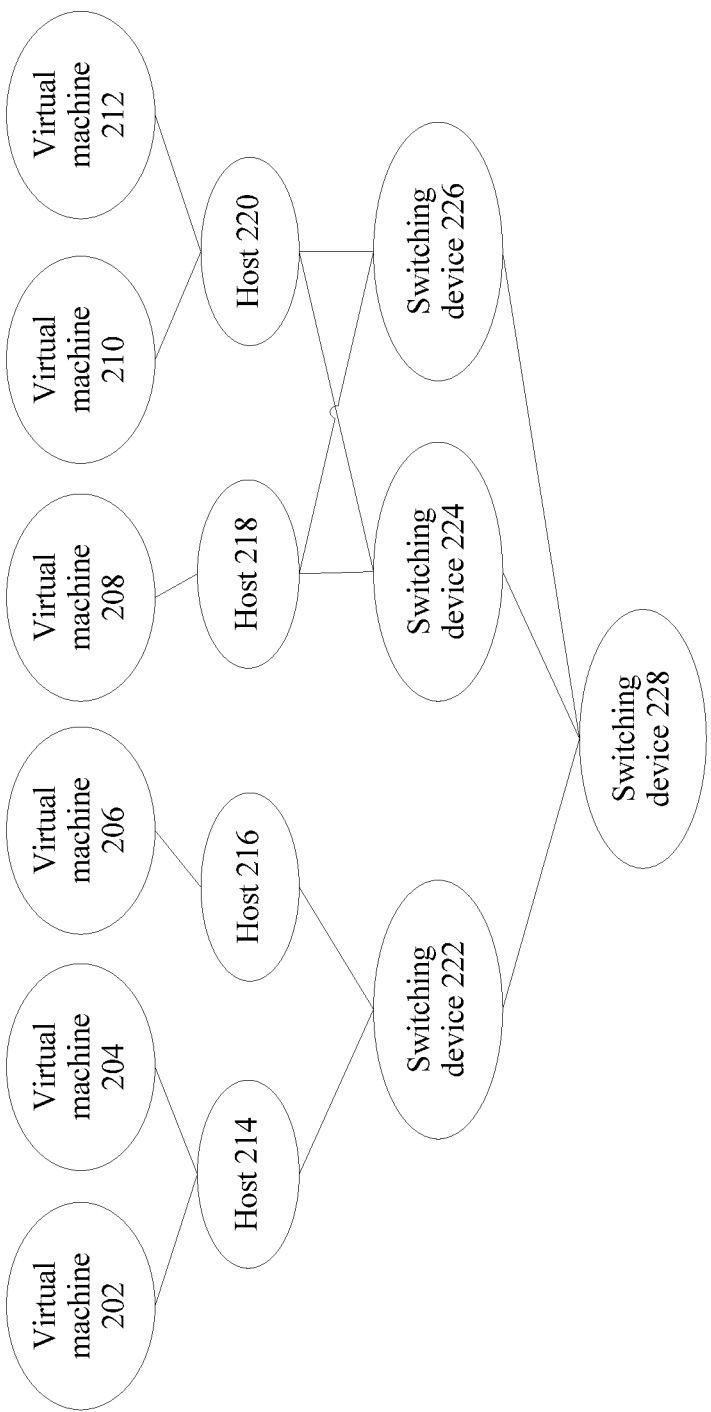
FIG. 1 is a schematic diagram of a component structure of a data center applied in an embodiment of the present invention.

The following clearly describes the technical solutions in the embodiments of the present invention with reference to the accompanying drawings in the embodiments of the present invention. Apparently, the described embodiments are some but not all of the embodiments of the present invention.

The term "virtual machine group" in this specification may specifically be one virtual machine group or multiple virtual machine groups. Each virtual machine group includes at least two virtual machines having a communications dependence relationship with each other. Specifically, a communications dependence relationship between virtual machines in a same virtual machine group may indicate that the virtual machines in the same virtual machine group cooperatively execute a same application or service. Therefore, the virtual machines in the same virtual machine group need to frequently communicate with each other. Because different virtual machine groups execute different applications or services, the different virtual machine groups usually do not need to communicate with each other. Even communication between different virtual machine groups is interrupted, an application or a service executed by each virtual machine group may not be affected.

The term "service weight" in this specification is specifically used to indicate an importance degree of an application or a service running on a virtual machine group, such as a subscriber category to which the service belongs, or an impact range of the service.

The term "communications path" in this specification specifically indicates any communications channel between any two virtual machines in a virtual machine group. For example, in FIG. 1, if a virtual machine 202, a virtual machine 208, and a virtual machine 210 belong to a same virtual machine group, there are two communications paths between the virtual machine 202 and the virtual machine 208: host 214—switching device 222—switching device 228—switching device 224—host 218, and host 214—switching device 222—switching device 228—switching device 226—host 218. By analogy, there are two communications paths between the virtual machine 202 and the virtual machine 210, and there are two communications paths between the virtual machine 208 and the virtual machine 210. There are six communications paths in the virtual machine group in total. If the switching device 224 is faulty and disconnected from another device, three communications paths are accordingly broken down in the virtual machine group.

FIG. 1 describes a schematic diagram of a component structure of a data center according to an embodiment of the present invention. Component devices of the data center include hosts 214 to 220 and switching devices 222 to 228. A virtual machine 202 and a virtual machine 204 run on the host 214, a virtual machine 206 runs on the host 216, a virtual machine 208 runs on the host 218, and a virtual machine 210 and a virtual machine 212 run on the host 220. The virtual machine 202 and the virtual machine 212 form a first virtual machine group, the virtual machine 204 and the virtual machine 206 form a second virtual machine group, and the virtual machine 208 and the virtual machine 210 form a third virtual machine group. The switching devices 222 to 228 are configured to communicatively connect any two component devices in the data center.

Figure 2:
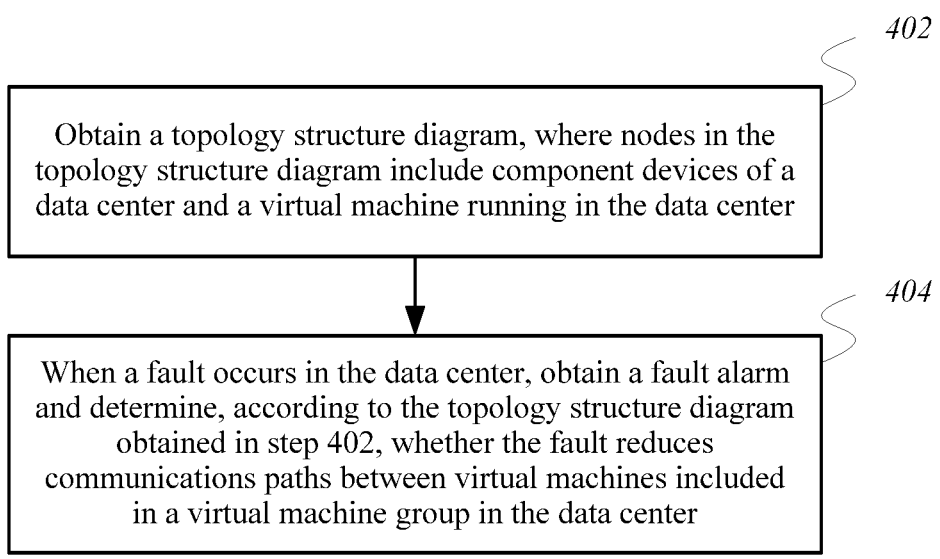
FIG. 2 is a schematic flowchart of a fault analysis method applied in a method embodiment of the present invention.

Referring to FIG. 2, the method embodiment provides a fault analysis method based on the data center shown in FIG. 1. It should be noted that the method may be executed by any server or host in the data center. In specific implementation, each vendor usually performs a fault analysis by using software installed in the server or host, such as Business Impact Manager of EMC, or Service Impact Analysis of HP. For ease of description, an entity for executing the method in this method embodiment is set as a host 214. The fault analysis method includes the following steps.

Step 402: The host 214 obtains a topology structure diagram, where nodes in the topology structure diagram include component devices of the data center and a virtual machine running on each host in the data center. In addition, a connection line in the topology structure diagram indicates a communications path between the component devices of the data center and a communications path between each host in the data center and the virtual machine running on each host.

Specifically, when the host 214 is started up in the data center, the host 214 traverses the component devices of the data center. The traversal may specifically be a component device discovery service. A common traversal algorithm includes a width-first traversal, a depth-first traversal, and the like. Then the host 214 obtains the topology structure diagram of the data center according to each host in the data center and the virtual machine running on each host. The nodes in the topology structure diagram include virtual machines 202 to 212, hosts 214 to 220, and switching devices 222 to 228. The connection line in the topology structure diagram indicates communications paths among the virtual machines, the hosts, and the switching devices in the data center. For example, FIG. 1 is a topology structure diagram of the data center.

Step 404: When a fault occurs in the data center, the host 214 obtains a fault alarm and determines, according to the topology structure diagram obtained in step 402, whether the fault reduces communications paths between virtual machines included in a virtual machine group in the data center.

Specifically, the fault may be a fault in a component device of the data center or a fault in a communications path between the component devices of the data center. For example, in FIG. 1, the fault may be a fault in any switching device or host in the data center, or may be a fault in a communications path between any two component devices in the data center, such as a fault in a communications path between the switching device 222 and the switching device 228. In this method embodiment, because the host 214 is a fault analysis device, a fault alarm is always sent to the host 214 when a fault occurs in any component device or in a communications path between the component devices in the data center. The fault alarm indicates the fault.

After obtaining the fault alarm, the host 214 determines, according to the topology structure diagram obtained in step 402, whether the fault reduces communications paths between virtual machines included in any virtual machine group of a first virtual machine group, a second virtual machine group, and a third virtual machine group. For example, communications paths between the virtual machine 202 and the virtual machine 212 included in the first virtual machine group originally include two communications paths in total: host 214—switching device 222—switching device 228—switching device 224—host 220, and host 214—switching device 222—switching device 228—switching device 226—host 220. In step 404, the host 214 performs a fault analysis for the first virtual machine group, that is, determines whether the fault reduces these two communications paths. Correspondingly, the host 214 may also perform corresponding fault analyses for the second virtual machine group and the third virtual machine group.

It should be noted that step 402 and step 404 may be continually performed in reality. Alternatively, the host 214 may perform step 402 once and obtain the topology structure diagram, and subsequently, when obtaining multiple fault alarms, the host 214 performs step 404 once for each fault alarm to complete the fault analysis.

Optionally, step 404 specifically includes: determining, by the host 214 after obtaining the fault alarm and according to a connection relationship between nodes that are in the topology structure diagram and corresponding to virtual machines included in any virtual machine group in the data center, whether the fault causes no available communications path between at least one virtual machine included in the virtual machine group and another virtual machine included in the virtual machine group; and determining, if there is no available communications path, that an error occurs in the virtual machine group. For example, after obtaining the fault alarm and deleting a component device or a communications path between component devices that is indicated by the fault alarm from the topology structure diagram, the host 214 launches a first traversal starting from any virtual machine included in any virtual machine group in the topology structure diagram. If all nodes cannot be traversed at the first traversal, all component devices traversed at the first traversal form a first topology substructure. The host 214 launches a second traversal starting from any component device that is not traversed at the first traversal, to obtain a second topology substructure, until all nodes are traversed. There is no communications connection among the obtained first topology substructure, second topology substructure, . . . , and $n^{th}$ topology substructure. Therefore, if virtual machines included in any virtual machine group run in two topology substructures, it indicates that the fault causes no available communications path between two virtual machine parts that are included in the virtual machine group but separated in two topology substructures, and an error occurs in the virtual machine group.

Figure 3:
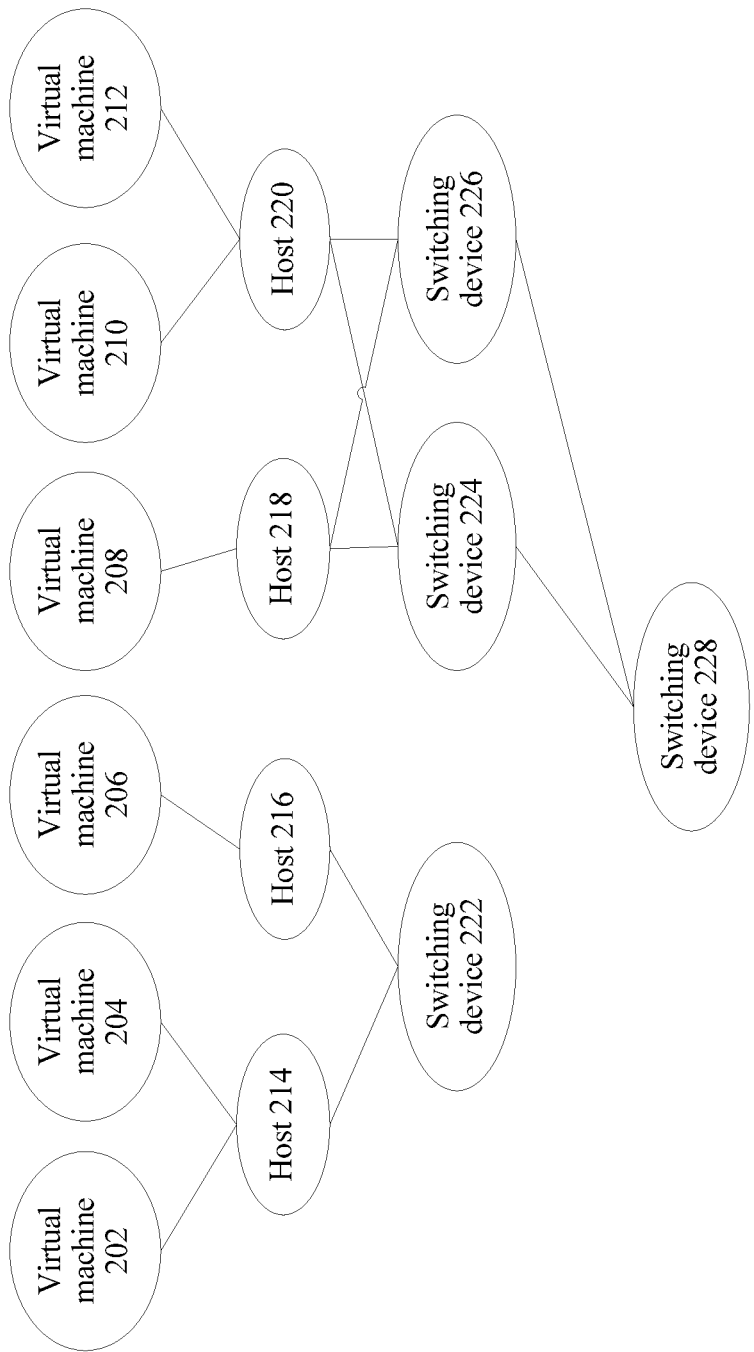
FIG. 3 is a schematic diagram of a component structure of another data center applied in an embodiment of the present invention.

For example, the fault alarm indicates a fault in a communications path between the switching device 222 and the switching device 228 in FIG. 1. Because of the fault in the communications path, the topology structure diagram of the data center in FIG. 1 is changed into a topology structure diagram shown in FIG. 3. The virtual machine 202, the virtual machine 204, the virtual machine 206, the host 214, the host 216, and the switching device 222 form a first topology substructure, and the virtual machine 208, the virtual machine 210, the virtual machine 212, the host 218, the host 220, the switching device 224, the switching device 226, and the switching device 228 form a second topology substructure. A first virtual machine group includes the virtual machine 202 and the virtual machine 212, which are located in the first topology substructure and the second topology substructure respectively. The fault causes no available communications path between the virtual machine 202 and the virtual machine 212 that are included in the first virtual machine group, and an error occurs in the first virtual machine group. By analogy, the fault alarm does not cause no available communications path between any virtual machine and another virtual machine in the second virtual machine group and the third virtual machine group.

For another example, after obtaining the fault alarm and deleting a component device or a communications path between component devices that is indicated by the fault alarm from the topology structure diagram, the host 214 determines whether a shortest path between virtual machines included in any virtual machine group exists in the topology structure diagram. If no shortest path exists, it indicates that the virtual machines included in the virtual machine group are separately located in two topology substructures and cannot be connected, that is, there is no available communications path.

Optionally, the foregoing virtual machine group may be multiple virtual machine groups. The host 214 performs the foregoing fault analysis method on all virtual machine groups in the data center, to determine a quantity of faulty virtual machine groups caused by the fault, such as m, (the faulty virtual machine group is a virtual machine group in which there is no available communications path between at least one virtual machine included in the virtual machine group and another virtual machine included in the virtual machine group), and a service weight of a faulty virtual machine group caused by the faultm, so as to obtain an impact parameter of the fault alarm. Specifically, for a service weight of each virtual machine group running on the data center and using FIG. 3 as an example, service weights of the first virtual machine group, the second virtual machine group, and the third virtual machine group are $n_1$, $n_2$, and $n_3$ respectively. Using the foregoing example, if the fault alarm indicates the fault in the communications path between the switching device 222 and the switching device 228, an error occurs only in the first virtual machine group (that is, m=1). The host 214 performs a calculation according to (A×m+B×$n_1$) or f(m, $n_1$) and outputs the impact parameter of the fault. After the impact parameter is obtained, an impact level of the fault is further output. For example, if the impact parameter is greater than a preset threshold, the fault alarm is an urgent fault, and needs to be rectified with priority. If the result is less than or equal to the preset threshold, the fault alarm is a secondary fault, and can be rectified after an urgent fault is rectified. The parameters A and B in the foregoing formula may be flexibly set according to requirements, and f(m, $n_1$) is any function by using m and $n_1$ as input parameters, and the function may be specifically flexibly set according to requirements.

In addition, many communications paths may exist between component devices in the data center. Some fault may not cause a break of a communications path between component devices in the data center, that is, cannot cause no available communications path between any two virtual machines included in each virtual machine group. If the fault analysis method in the foregoing alternative solution is performed, it may be concluded that this type of fault alarms exerts no impact on a service or an application running on the data center. That is, no error occurs in each virtual machine group in the data center. For example, the switching device 224 and the switching device 226 in FIG. 1 are two parallel switching devices. A fault occurring in either of the two switching devices cannot cause a break of a communications path between any two component devices. However, the switching device 224 and the switching device 226 jointly form a communications path among the host 218, the host 220, and the switching device 228. If a fault occurs in either of the two switching devices, although the communications path cannot be broken down, reliability of the communications path is reduced, bandwidth and serving quality of the communications path may also be affected. Therefore, step 404 in which the host 214 determines, according to the topology structure diagram, whether communications paths between virtual machines in each virtual machine group are reduced may include the following alternative solution.

Optionally, after obtaining the fault alarm, the host 214 determines, according to a connection relationship between nodes that are in the topology structure diagram and corresponding to virtual machines included in the virtual machine group in the data center, whether the fault reduces communications paths between the virtual machines included in the virtual machine group, that is, whether a broken communications path exists between the virtual machines. If the fault reduces the communications paths between the virtual machines included in the virtual machine group, an error occurs in the virtual machine group. In addition, the host 214 further obtains a fault ratio of a faulty virtual machine group. Specifically, a fault ratio of any virtual machine group indicates a ratio of a quantity of broken communications paths, caused by the fault, between virtual machines included the virtual machine group to a total quantity of communications paths between the virtual machines included the virtual machine group.

Figure 4:
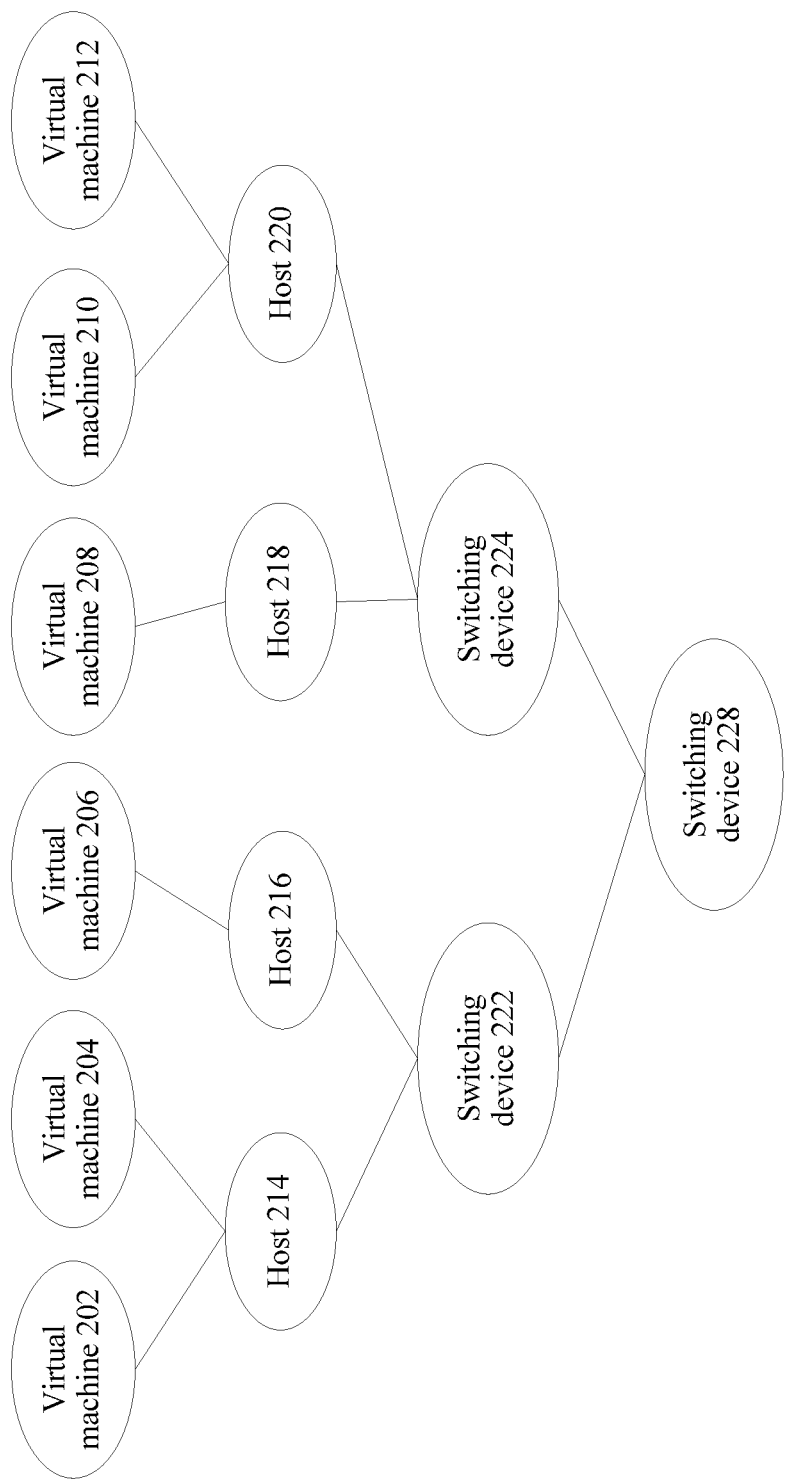
FIG. 4 is a schematic diagram of a component structure of still another data center applied in an embodiment of the present invention.

For example, the host 214 obtains a fault alarm, and the fault alarm indicates that a fault occurs in the switching device 226. Because of the fault in the switching device 226, the topology structure diagram of the data center in FIG. 1 is changed into a topology structure diagram shown in FIG. 4. If the foregoing solution is performed, it may be concluded that the fault alarm does not cause a break of a communications path between any two virtual machines included in any virtual machine group. However, functions of the switching device 226 and the switching device 224 are equivalent, and both the switching device 226 and the switching device 224 are used in communication between the virtual machine 208, the virtual machine 210, and the virtual machine 212 and between the virtual machine 208, the virtual machine 210, and the virtual machine 212 and the virtual machine 202, the virtual machine 204, and the virtual machine 206. Therefore, the fault in the switching device 226 reduces reliability of the communication between the virtual machine 208, the virtual machine 210, and the virtual machine 212, and reduces reliability of the communication between the virtual machine 208, the virtual machine 210, and the virtual machine 212 and the virtual machine 202, the virtual machine 204, and the virtual machine 206. That is, reliability of the communications paths in the first virtual machine group (between the virtual machine 202 and the virtual machine 212) and the third virtual machine group (between the virtual machine 208 and the virtual machine 210) is reduced. For two communications paths of the first virtual machine group: host 214—switching device 222— switching device 228—switching device 224—host 220, and host 214—switching device 222—switching device 228—switching device 226—host 220, the fault causes a break of the later communications path, and a fault ratio of the first virtual machine group is 0.5. Likewise, a fault ratio 0.5 of the third virtual machine group may be obtained.

Optionally, the foregoing virtual machine group may be multiple virtual machine groups. The host 214 performs the foregoing fault analysis method on all virtual machine groups in the data center, to determine a quantity of faulty virtual machine groups caused by the fault, such as M, (the faulty virtual machine group is a virtual machine group in which a break occurs in a communications path between virtual machines included in the virtual machine group), and a service weight of a virtual machine group affected by the fault alarm. For example, service weights of the M virtual machine groups are $N_1$, $N_2$, ..., and $N_M$ respectively, and fault ratios of the M virtual machine groups are $X_1$, $X_2$, ..., and $X_M$ respectively. The host 214 obtains an impact parameter of the fault according to $N_1, N_2, \ldots, N_M$ and $X_1, X_2, \ldots, X_M$. Specifically, the host 214 performs a calculation according to $f(N_1, N_2, \ldots, N_M, X_1, X_2, \ldots, X_M)$ to obtain the impact parameter. After the impact parameter is obtained, an impact level of the fault may be further output. For example, if the impact parameter is greater than a preset threshold, the fault alarm is an urgent fault, and needs to be rectified with priority. If the result is less than or equal to the preset threshold, the fault alarm is a secondary fault, and can be rectified after an urgent fault is rectified. $F(N_1, N_2, \ldots, N_M, X_1, X_2, \ldots, X_M)$ is any function by using $N_1, N_2, \ldots, N_M$ and $X_1, X_2, \ldots, X_M$ as input parameters, and the function may be specifically flexibly set according to requirements.

Optionally, the virtual machine included in the virtual machine group specifically indicates a virtual machine for cooperatively executing a same service or application.

It should be noted that, in various alternative methods in this method embodiment, when multiple fault alarms occur in a data center, impact caused by each fault on a communications path between virtual machines in a virtual machine group running on the data center is analyzed, and an impact level of each fault is obtained, to determine priorities for rectifying multiple faults. This ensures that a faulty device that exerts greatest impact on the virtual machine group is rectified with priority, and ensures an operation performance of the data center as much as possible. Further, in a simulated scenario in which a fault occurs in each component device or in each communications path between component devices in the data center, an impact level of the fault on the operation performance of the data center is obtained for each component device or each communications path between component devices. For example, in a simulated scenario in which the host 214 successively receives fault alarms indicating that faults occur in the host 214 to the host 220 and the switching device 222 to the switching device 228, an impact level of a fault when the fault occurs in each component device is obtained, and importance priorities of the host 214 to the host 220 and the switching device 222 to the switching device 228 are obtained. Therefore, when the data center is maintained, a component device with a high importance priority is maintained with priority, to reduce a fault occurrence probability of an important component device.

A fault analysis method based on a data center is provided above. When a fault occurs in the data center, a fault alarm is sent to a device that performs a fault analysis. The device analyzes, according to a previously obtained topology structure diagram of the data center, whether the fault affects a communications path between virtual machines in a virtual machine group running on the data center, and comprehensively obtain an impact level of the fault alarm on the data center according to a quantity of affected virtual machine groups, a service weight of an affected virtual machine group, and optionally, a fault ratio of the affected virtual machine group. Therefore, importance of the fault is not determined according to only a type of a faulty device or a fault degree of a faulty device in an existing fault analysis method, and actual impact of the fault on each service running on the data center can be comprehensively analyzed. This promotes accuracy of a fault analysis in the data center, and promotes a fault analysis capability and a fault response capability of the data center.

Figure 5:
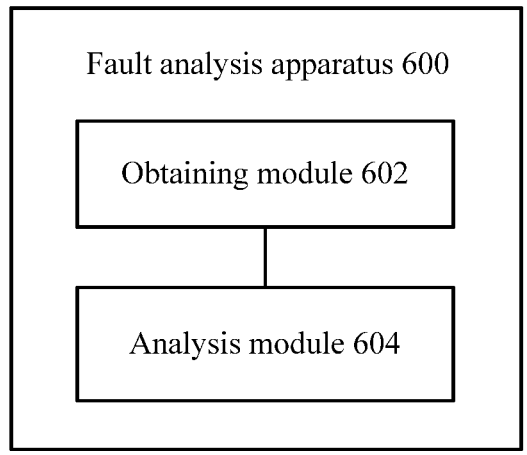
FIG. 5 is a schematic diagram of a component structure of a fault analysis apparatus applied in an apparatus embodiment of the present invention.

An apparatus embodiment provides a fault analysis apparatus 600. A schematic diagram of an organizational structure of the fault analysis apparatus 600 is shown in FIG. 5. The fault analysis apparatus 600 is actually applied to the data center shown in FIG. 1, may be any host or server in the data center shown in FIG. 1, and includes an obtaining module 602 and an analysis module 604.

The obtaining module 602 is configured to obtain a topology structure diagram, and nodes in the topology structure diagram include component devices of the data center and a virtual machine running on the data center.

Specifically, the obtaining module 602 actually executes step 402 in the method embodiment and each alternative solution in the method embodiment, and details are not described herein.

The analysis module 604 is configured to: when a fault occurs in the data center, obtain a fault alarm and determine, according to the topology structure diagram, whether the fault reduces communications paths between virtual machines in a virtual machine group.

Specifically, the analysis module 604 actually executes step 404 in the method embodiment and each alternative solution in the method embodiment, and details are not described herein.

Optionally, the data center has at least two virtual machine groups. The fault analysis apparatus 600 further includes: a first calculation module, configured to obtain an impact level of the fault according to a quantity of faulty virtual machine groups caused by the fault and a service weight corresponding to each faulty virtual machine group.

Optionally, the data center has at least two virtual machine groups. The fault analysis apparatus 600 further includes: a second calculation module, configured to obtain an impact level of the fault according to a fault ratio, caused by the fault, of each virtual machine group and a service weight corresponding to each virtual machine group.

Optionally, at least two virtual machines that have a communications dependence relationship and form a virtual machine group specifically indicate at least two virtual machines for cooperatively executing a same service or application.

A fault analysis apparatus based on a data center is provided above. The fault analysis apparatus first obtains a topology structure diagram of the data center. After obtaining a fault alarm, the fault analysis apparatus analyzes, according to the previously obtained topology structure diagram of the data center, whether the fault affects a communications path between virtual machines in a virtual machine group running on the data center, and comprehensively obtains an impact level of the fault alarm on the data center according to a quantity of affected virtual machine groups, a service weight of an affected virtual machine group, and optionally, a fault ratio of the affected virtual machine group. Therefore, importance of the fault is not determined according to only a type of a faulty device or a fault degree of a faulty device in an existing fault analysis method, and actual impact of the fault on each service running on the data center can be comprehensively analyzed. This promotes accuracy of a fault analysis in the data center, and promotes a fault analysis capability and a fault response capability of the data center.

Figure 6:
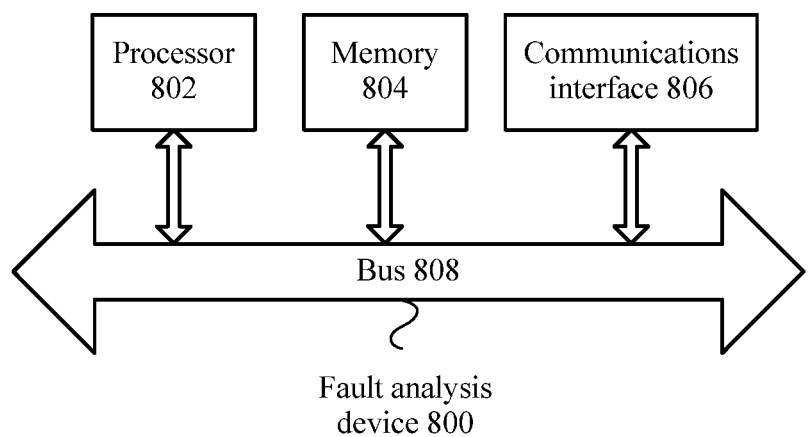
FIG. 6 is a schematic diagram of a component structure of a fault analysis device applied in a device embodiment of the present invention.

A device embodiment provides a fault analysis device 800. A schematic diagram of an organizational structure of the fault analysis device 800 is shown in FIG. 6. The fault analysis device 800 is actually applied to the data center shown in FIG. 1, and may be any host or server in the data center shown in FIG. 1.

The fault analysis device 800 comprises a processor 804, a memory 804, a communications interface 806, and a bus 808. The processor 802, the memory 804, and the communications interface 806 are communicatively connected to each other by using the bus 808.

The processor 802 may use a general-purpose central processing unit (CPU), a microprocessor, an application specific integrated circuit (ASIC), or one or more integrated circuits, and is configured to execute a related program, so as to implement technical solutions provided in the foregoing method embodiment of the present invention.

The memory 804 may be a read-only memory (ROM), a static storage device, a dynamic storage device, or a random access memory (RAM). The memory 804 may store an operating system and another application program. When technical solutions provided in this embodiment of the present invention are implemented by using software or firmware, program code used to implement the technical solutions provided in the foregoing method embodiment of the present invention is stored in the memory 804, and is executed by the processor 802.

The communications interface 806 is configured to communicate with another component device or virtual machine in the data center.

The bus 808 may include a path for transmitting information between components of the fault analysis device 800.

A fault analysis device based on a data center is provided above. The fault analysis device runs program code stored by the fault analysis device. The fault analysis device first obtains a topology structure diagram of the data center. After obtaining a fault alarm, the fault analysis device analyzes, according to the previously obtained topology structure diagram of the data center, whether the fault affects a communications path between virtual machines in a virtual machine group running on the data center. Therefore, importance of the fault is not determined according to only a type of a faulty device or a fault degree of a faulty device in an existing fault analysis method, and actual impact of the fault on each service running on the data center can be comprehensively analyzed. This promotes accuracy of a fault analysis in the data center, and promotes a fault analysis capability and a fault response capability of the data center.

It should be noted that, for ease of description, the foregoing method embodiments are described as a series of action combinations. However, persons skilled in the art should understand that the present invention is not limited to the described sequence of the actions, because some steps may be performed in another sequence or performed at the same time according to the present invention. In addition, persons skilled in the art should also understand that the embodiments described in this specification all belong to preferred embodiments, and the involved actions and units are not necessarily mandatory to the present invention.

In the foregoing embodiments, the description of each embodiment has respective focuses. For a part that is not described in detail in an embodiment, reference may be made to related descriptions in other embodiments.

Finally, it should be noted that the foregoing embodiments are merely intended for describing the technical solutions of the present invention but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of the present invention.

What is claimed is:

1. A method, comprising:
obtaining, by a host, a topology structure diagram describing the structure of a data center, the obtaining comprising traversing devices of the data center using a component device discovery service;
obtaining, by the host, a fault alarm which indicates a fault occurs in the data center wherein the fault causes the loss of a communications path for a component;
performing, by the host, a fault analysis for a virtual machine group; and
determining, by the host, according to the topology structure diagram, whether the fault reduces communications paths between a plurality of virtual machines in the virtual machine group;
wherein the data center comprises component devices, and wherein the component devices comprise a plurality of hosts and one or more switching devices;
wherein each virtual machine of the plurality of virtual machines runs on a host in the plurality of hosts, the one or more switching devices are configured to establish a communication path between the component devices, and wherein virtual machines of the plurality of virtual machines that have a communications dependence relationship and run on the plurality of hosts form a virtual machine group;
wherein nodes in the topology structure diagram comprise the component devices and the virtual machines that run on the plurality of hosts; and
wherein determining, by the host, according to the topology structure diagram, whether the fault reduces communications paths between a plurality of virtual machines in the virtual machine group comprises:
deleting a component device of the component devices, or a communications path between the component devices, that is indicated by the fault alarm from the topology structure diagram;
launching a first traversal starting from a virtual machine included in a virtual machine group in the topology structure diagram;
determining if all nodes of the topology structure diagram cannot be traversed on a first traversal and grouping all component devices traversed on the first traversal in a first topology substructure;
launching, in response to determining that not all nodes in the topology structure diagram have not yet been traversed, subsequent traversals starting from any component device that has not yet been traversed, to obtain a new topology substructure, until a plurality of topology substructures have been obtained and all component devices of the topology structure diagram have been traversed; and determining if virtual machines in a virtual machine group run in two topology structures wherein determining that virtual machines in the virtual machine group run in two topology structures indicates the fault reduces communications paths between the plurality of virtual machines in the virtual machine group.

2. The method according to claim 1, wherein the determining whether the fault reduces communications paths between the plurality of virtual machines in the virtual machine group comprises:

determining, according to a connection relationship between the nodes in the topology structure diagram, that the fault causes no available communications path between a virtual machine in the virtual machine group and another virtual machine in the virtual machine group; and wherein the method further comprises:
determining that an error occurs in the virtual machine group.

3. The method according to claim 2, wherein the data center comprises a plurality of virtual machine groups, and the method further comprises:

obtaining an impact level of the fault according to a quantity of faulty virtual machine groups caused by the fault and a service weight corresponding to each faulty virtual machine group.

4. The method according to claim 1, wherein the determining whether the fault reduces communications paths between the plurality of virtual machines in the virtual machine group comprises:

determining a fault ratio of the virtual machine group according to a connection relationship between nodes in the topology structure diagram, wherein the fault ratio indicates a ratio of a quantity of broken communications paths, caused by the fault, between the plurality of virtual machines in the virtual machine group to a total quantity of communications paths between the plurality of virtual machines in the virtual machine group.

5. The method according to claim 4, wherein the data center comprises a plurality of virtual machine groups, and the method further comprises:

obtaining an impact level of the fault according to a fault ratio, caused by the fault, of each virtual machine group and a service weight corresponding to each virtual machine group.

6. The method according to claim 1, wherein the communications dependence relationship of the plurality of virtual machines indicates the plurality of virtual machines cooperatively execute a same service.

7. The method according to claim 1, wherein the host continually performs the obtaining the topology structure diagram.

8. The method according to claim 1, wherein the obtaining, by the host, a topology structure diagram describing the structure of a data center is performed once to obtain the topology structure diagram, and the method further comprises:

determining, by the host, if the topology structure diagram is to be updated in response to each obtaining, by the host, a fault alarm which indicates a fault occurs in the data center; and updating, by the host, the topology structure diagram according to the determination the topology structure diagram is to be updated and the determining whether the fault reduces communications paths between the plurality of virtual machines in the virtual machine group.

9. A computing device, comprising:
a processor;
a memory; and
a bus;
wherein the memory is configured to store an execution instruction, the processor and the memory are connected using the bus, and when the computing device runs, the processor executes the execution instruction stored in the memory to:

obtain a topology structure diagram describing the structure of a data center, the obtaining comprising traversing devices of the data center using a component device discovery service, wherein nodes in the topology structure diagram comprise component devices of a data center and virtual machines that run on a plurality of hosts of the data center;

obtain a fault alarm which indicates a fault occurs in the data center wherein the fault causes the loss of a communications path for a component;

perform a fault analysis for a virtual machine group; and determine, according to the topology structure diagram, whether the fault reduces communications paths between a plurality of virtual machines in a virtual machine group, wherein the plurality of virtual machines have a communications dependence relationship wherein the processor executing the execution instruction to determine, according to the topology structure diagram, whether the fault reduces communications paths between the plurality of virtual machines in the virtual machine group includes the processor executing the execution instruction to:

delete a component device of the component devices, or a communications path between the component devices, that is indicated by the fault alarm from the topology structure diagram;

launch a first traversal starting from a virtual machine included in a virtual machine group in the topology structure diagram;

determine if all nodes of the topology structure diagram cannot be traversed on a first traversal and grouping all component devices traversed on the first traversal in a first topology substructure;

launch, in response to determining that not all nodes in the topology structure diagram have not yet been traversed, subsequent traversals starting from any component device that has not yet been traversed, to obtain a new topology substructure, until a plurality of topology substructures have been obtained and all component devices of the topology structure diagram have been traversed; and determine if the virtual machines in the virtual machine group run in two topology structures wherein determining that the virtual machines in the virtual machine group run in two topology structures indicates the fault reduces communications paths between the plurality of virtual machines in the virtual machine group.

10. The computing device according to claim 9, wherein the determining whether the fault reduces communications paths between the plurality of virtual machines in the virtual machine group comprises:

determining, according to a connection relationship between the nodes in the topology structure diagram, that the fault causes no available communications path between a virtual machine in the virtual machine group and another virtual machine in the virtual machine group; and wherein the method further comprises:
determining that an error occurs in the virtual machine group.

11. The computing device according to claim 10, wherein the data center comprises a plurality of virtual machine groups, and the method further comprises:
obtaining an impact level of the fault according to a quantity of faulty virtual machine groups caused by the fault and a service weight corresponding to each faulty virtual machine group.

12. The computing device according to claim 9, wherein the determining whether the fault reduces communications paths between the plurality of virtual machines in the virtual machine group comprises:
determining a fault ratio of the virtual machine group according to a connection relationship between nodes in the topology structure diagram, wherein the fault ratio indicates a ratio of a quantity of broken communications paths, caused by the fault, between the plurality of virtual machines in the virtual machine group to a total quantity of communications paths between the plurality of virtual machines in the virtual machine group.

13. The computing device according to claim 12, wherein the data center comprises a plurality of virtual machine groups, and the method further comprises:
obtaining an impact level of the fault according to a fault ratio, caused by the fault, of each virtual machine group and a service weight corresponding to each virtual machine group.

14. The computing device according to claim 9, wherein the communications dependence relationship of the plurality of virtual machines indicates the plurality of virtual machines cooperatively execute a same service.

15. A non-transitory computer-readable storage medium comprising instructions which, when executed by a computer device, cause the computer device to:
obtain a topology structure diagram describing the structure of a data center, the obtaining comprising traversing devices of the data center using a component device discovery service, wherein nodes in the topology structure diagram comprise component devices of a data center and virtual machines that run on a plurality of hosts of the data center;
obtain a fault alarm which indicates a fault occurs in the data center wherein the fault causes the loss of a communications path for a component;
perform a fault analysis for a virtual machine group; and
determine, according to the topology structure diagram, whether the fault reduces communications paths between a plurality of virtual machines in a virtual machine group, wherein the plurality of virtual machines have a communications dependence relationship wherein the computer device executing the execution instruction to determine, according to the topology structure diagram, whether the fault reduces communications paths between the plurality of virtual machines in the virtual machine group includes the computer device executing the execution instruction to:
delete a component device of the component devices, or a communications path between the component devices, that is indicated by the fault alarm from the topology structure diagram;
launch a first traversal starting from a virtual machine included in a virtual machine group in the topology structure diagram;
determine if all nodes of the topology structure diagram cannot be traversed on a first traversal and grouping all component devices traversed on the first traversal in a first topology substructure;
launch, in response to determining that not all nodes in the topology structure diagram have not yet been traversed, subsequent traversals starting from any component device that has not yet been traversed, to obtain a new topology substructure, until a plurality of topology substructures have been obtained and all component devices of the topology structure diagram have been traversed; and
determine if the virtual machines in the virtual machine group run in two topology structures wherein determining that the virtual machines in the virtual machine group run in two topology structures indicates the fault reduces communications paths between the plurality of virtual machines in the virtual machine group.

16. The non-transitory computer-readable storage medium of claim 15, wherein the determining whether the fault reduces communications paths between the plurality of virtual machines in the virtual machine group comprises:
determining, according to a connection relationship between the nodes in the topology structure diagram, that the fault causes no available communications path between a virtual machine in the virtual machine group and another virtual machine in the virtual machine group; and wherein the method further comprises:
determining that an error occurs in the virtual machine group.

17. The non-transitory computer-readable storage medium of claim 16, wherein the data center comprises a plurality of virtual machine groups, and the instructions further comprise instruction for:
obtaining an impact level of the fault according to a quantity of faulty virtual machine groups caused by the fault and a service weight corresponding to each faulty virtual machine group.

18. The non-transitory computer-readable storage medium of claim 15, wherein the determining whether the fault reduces communications paths between the plurality of virtual machines in the virtual machine group comprises:
determining a fault ratio of the virtual machine group according to a connection relationship between nodes in the topology structure diagram, wherein the fault ratio indicates a ratio of a quantity of broken communications paths, caused by the fault, between the plurality of virtual machines in the virtual machine group to a total quantity of communications paths between the plurality of virtual machines in the virtual machine group.

19. The non-transitory computer-readable storage medium of claim 18, wherein the data center comprises a plurality of virtual machine groups, and the method further comprises:
obtaining an impact level of the fault according to a fault ratio, caused by the fault, of each virtual machine group and a service weight corresponding to each virtual machine group.

20. The non-transitory computer-readable storage medium of claim 15, wherein the communications dependence relationship of the plurality of virtual machines indicates the plurality of virtual machines cooperatively execute a same service.

* * * * *